United States Patent
Sano et al.

(10) Patent No.: US 9,385,103 B2
(45) Date of Patent: Jul. 5, 2016

(54) SEMICONDUCTOR DEVICE MANUFACTURING METHOD

(71) Applicant: FUJI ELECTRIC CO., LTD., Kawasaki-shi (JP)

(72) Inventors: Shinji Sano, Matsumoto (JP); Tatsuo Nishizawa, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 81 days.

(21) Appl. No.: 14/251,115

(22) Filed: Apr. 11, 2014

(65) Prior Publication Data
US 2014/0312102 A1    Oct. 23, 2014

(30) Foreign Application Priority Data
Apr. 17, 2013    (JP) ................. 2013-086433

(51) Int. Cl.
*B23K 31/00*    (2006.01)
*B23K 31/02*    (2006.01)
*H01L 23/00*    (2006.01)

(52) U.S. Cl.
CPC ............... *H01L 24/75* (2013.01); *H01L 24/83* (2013.01); *H01L 24/29* (2013.01); *H01L 24/32* (2013.01); *H01L 24/48* (2013.01); *H01L 24/73* (2013.01); *H01L 24/92* (2013.01); *H01L 2224/26175* (2013.01); *H01L 2224/291* (2013.01); *H01L 2224/292* (2013.01); *H01L 2224/29007* (2013.01); *H01L 2224/29111* (2013.01); *H01L 2224/29299* (2013.01); *H01L 2224/32225* (2013.01); *H01L 2224/48227* (2013.01); *H01L 2224/73265* (2013.01); *H01L 2224/7531* (2013.01); *H01L 2224/75303* (2013.01); *H01L 2224/75705* (2013.01); *H01L 2224/83065* (2013.01); *H01L 2224/83101* (2013.01); *H01L2224/83209* (2013.01); *H01L 2224/83385* (2013.01); *H01L 2224/83815* (2013.01); *H01L 2224/92247* (2013.01); *H01L 2924/12042* (2013.01); *H01L 2924/13055* (2013.01); *H01L 2924/3511* (2013.01)

(58) Field of Classification Search
CPC ............ H01L 24/75; H01L 2924/3511; H01L 2224/8121; H01L 23/562; H01L 21/67288; H01L 21/67333; H01L 21/6835; H01L 21/6838; H01L 2221/68345; H01L 2224/16; H05K 1/0271; H05K 3/225; H05K 3/341; H05K 3/3494; B23K 1/0016; B23K 2201/40
See application file for complete search history.

(56) References Cited

U.S. PATENT DOCUMENTS

2009/0134204 A1    5/2009    Kimbara
2012/0229999 A1*   9/2012    Hussain ............. G01R 31/2886
                                                           361/783

FOREIGN PATENT DOCUMENTS

JP    H06-163612 A    6/1994
JP    2008-147555 A   6/2008
JP    2011-249578 A   12/2011

*Primary Examiner* — Erin Saad
(74) *Attorney, Agent, or Firm* — Manabu Kanesaka

(57) ABSTRACT

A method for manufacturing a semiconductor device, includes preparing a solder, a soldering article, a base material, a weight having a foot where a center of gravity of the weight is shifted from a center of the soldering article, a positioning jig having a hole for holding the soldering article in the base material, and a dam member; disposing the dam member on a side having a relatively lower height due to a warp of an edge portion of the base material; placing the positioning jig on a principal surface of the base material; placing the soldering article on the solder in the hole; placing the weight on an upper surface of the soldering article to position the center of gravity on the side having relatively lower height; and raising the temperature of the solder to a temperature equal to or higher than the melting point of the solder.

10 Claims, 6 Drawing Sheets

SEMICONDUCTOR DEVICE MANUFACTURING METHOD

RELATED APPLICATIONS

The present application claims priority from Japanese Application No. 2013-086433 filed Apr. 17, 2013.

BACKGROUND OF THE INVENTION

1. Field of the Invention

The present invention relates to a semiconductor device manufacturing method, wherein a soldering weight is used in, for example, a soldering step in manufacturing a power semiconductor module.

2. Description of the Background Art

In the process of manufacturing a power semiconductor module such as an IGBT module, the step of soldering power semiconductor elements to a circuit substrate, and the circuit substrate to a metal base plate is commonly carried out. When soldering a soldering article to a base material in this way, there may arise a problem such that when a solder interposed between the soldering article and base material melts, the position of the soldering article is shifted due to the surface tension of the molten solder, or the solder does not spread all over the bonding surface of the soldering article. As the method of suppressing this kind of problem, there is proposed a method of applying pressure to the molten solder by placing a weight on the soldering article when in the soldering step (for example, JP-A-2007-180456, JP-A-6-163612, and JP-A-2011-249578).

It is known that a warp occurs in the base material in the soldering step of the power semiconductor module.

For example, when soldering the base material and circuit substrate, the base material and circuit substrate have different coefficients of thermal expansion, meaning that the base material warps in an upward convex direction after solder has been solidified.

Figure 5:
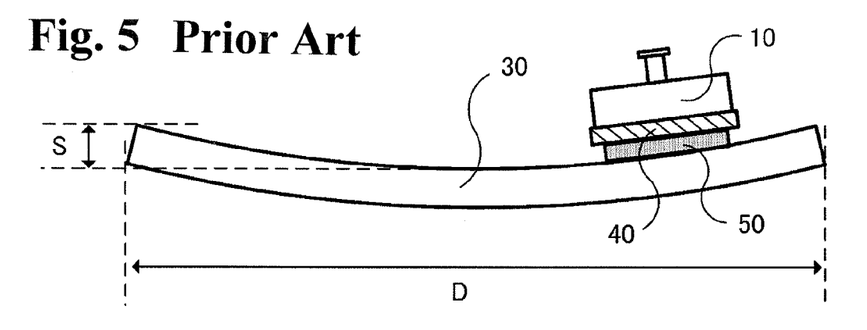
FIG. 5 is a schematic diagram of a semiconductor device manufacturing process for illustrating a heretofore known example.

In the power semiconductor module, the warp of the base material in the upward convex direction is undesirable because it causes uneven spread in a coating of thermal compound when mounting the base material on heat radiating fins, thus leading to a decrease in heat radiation. Therefore, it is often the case that the base material, before being soldered, is intentionally warped in a downward convex direction in advance in order to cancel the warp caused when soldering and to flatten the base material. A schematic diagram is shown in FIG. 5.

Figure 6A:
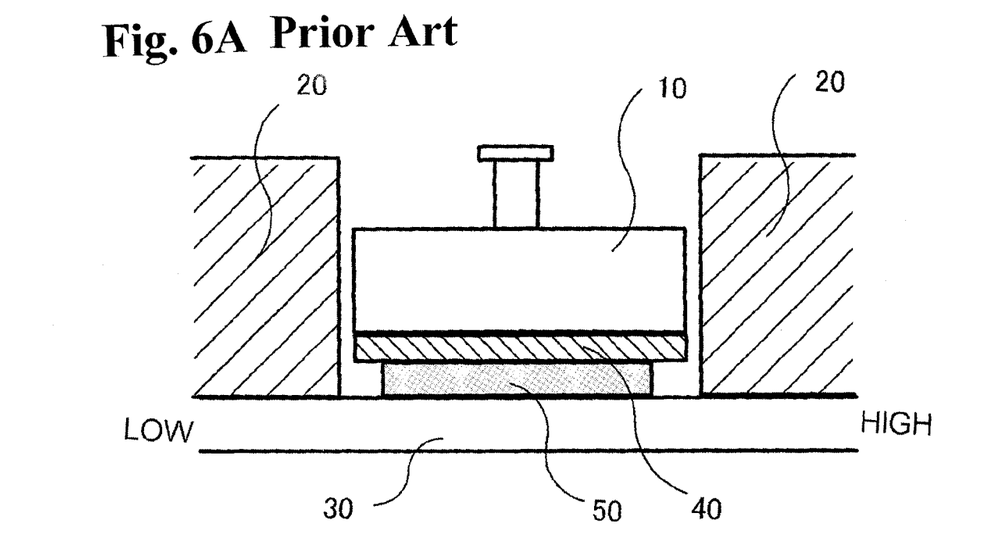
Figure 6B:
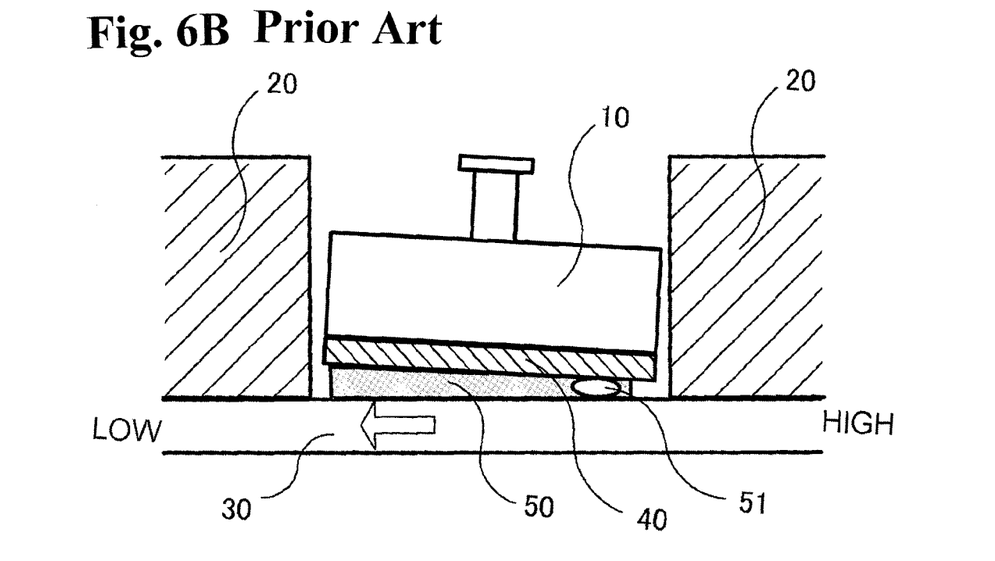
FIG. 6B showing a condition in which the solder is being melted.

In this way, it has been revealed from an earnest research by the present inventor that, when a soldering step is carried out with a weight 10 placed on a base material 30 having a warp when in the soldering step (FIG. 6A), as previously described, a solder 50 flows into the side with a lower height due to gravity when the solder 50 melts, meaning that the effect of evenly spreading the solder 50 over a bonding surface decreases even by mounting the weight 10. Because of this, the solder thickness of a portion of the base material 30 with a higher height decreases, and a void 51 is also generated (FIG. 6B), meaning that an adverse effect occurs in the heat radiation characteristics when the power semiconductor module operates.

Also, it has heretofore been common in manufacturing the power semiconductor module that a wiring step is carried out on the upper surface of the soldering article by wire bonding after the step of soldering the soldering article to the base material. In recent years, however, the step of carrying out an operation test in units of soldering articles after the wiring step has been carried out on the upper portion and then soldering only a good article to the base material is being prevailing. This is because the amount of loss is large when an operation test is carried out after all soldering articles have been soldered to the base material, and if only some of the soldering articles are found defective.

As the upper wiring interferes with the weight when soldering the soldering article, on the upper portion of which the wiring step has been carried out, to the base material in this way, it is not possible to use the technique of applying pressure to the molten solder using the weight in the previously described heretofore known technology.

SUMMARY OF THE INVENTION

The invention, having been contrived bearing in mind this kind of point, has an object of providing a semiconductor device manufacturing method whereby it is possible, in a soldering step of a power semiconductor module, to suppress an occurrence of an uneven thickness of solder, or a void therein, due to a warp of a base material, and carry out stable soldering in spite of the presence or absence of an upper wiring of a soldering article, and a soldering weight used in the method.

In order to achieve the object, in one aspect of the invention, a semiconductor device manufacturing method is configured in the following way. A solder; a soldering article; a base material including a principal surface having a different height due to a warp at a temperature equal to or higher than a melting point of the solder; a weight having a foot only on an edge on a side facing the soldering article so that the center of gravity is shifted from the center of the soldering article; a positioning jig having a hole to hold the soldering article in a predetermined region of the principal surface of the base material; and a dam member to stem the molten solder, are prepared. The dam member is disposed in an edge portion, of the edge of the predetermined region of the principal surface of the base material, on a side having a relatively lower height due to the warp. Next, the positioning jig is placed on the principal surface of the base material, the solder and soldering article are placed in the hole with the soldering article superimposed on the solder, and the weight is placed on the upper surface of the soldering article so that the center of gravity is positioned on the side having relatively lower height due to the warp. Further, the temperature of the solder is raised to a temperature equal to or higher than the melting point of the solder.

Also, in another aspect of the invention, a soldering weight includes a main body and a foot disposed only on an edge of a surface of the main body opposite to a soldering article, and the center of gravity is shifted from the center of the main body.

According to the heretofore described aspects, as the dam member is disposed in a portion on the base material on the side with a lower height, a flow of the solder is stemmed. Also, the weight is disposed so that the center of gravity of the weight is shifted to a position having a lower height due to the warp, rather than being placed in the center of the soldering article, thereby extruding solder on the side with a lower height to the side with a higher height. Because of this, the thickness of the solder for bonding the soldering article is equalized, and an occurrence of a void is suppressed. Also, as it is possible to prevent the weight from interfering with structural objects, for example, bonding wires or semiconductor elements, on the upper surface of the soldering article,

BRIEF DESCRIPTION OF THE DRAWINGS

FIGS. 2A and 2B are schematic diagrams of a semiconductor device manufacturing method according to the embodiment, wherein

FIGS. 3A and 3B are bottom views showing shapes of a foot of the soldering weight according to the embodiments, wherein

FIGS. 4A to 4C are plan views showing layouts of a dam member according to the embodiments, wherein

FIGS. 6A and 6B are schematic diagrams of a semiconductor device manufacturing method for illustrating a heretofore known example, wherein FIG. 6A showing a weight being placed on a base material having a warp in the soldering step.

DETAILED DESCRIPTION OF THE INVENTION

Hereafter, a description will be given, based on the drawings, of preferred embodiments (working examples) of the invention.

The same components are given the same reference signs throughout the embodiment, and a redundant description will be omitted.

The working examples, not being limited to the described embodiment, can be changed into various forms without departing from the technical idea of the invention.

Figure 1A:
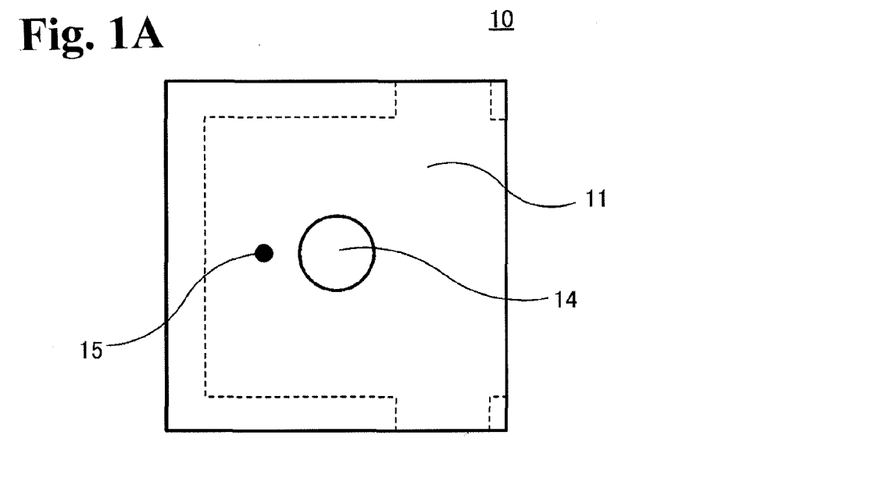
FIGS. 1A, 1B, and 1C are a plan view, a front view, and a bottom view of a soldering weight according to an embodiment.
Figure 1B:
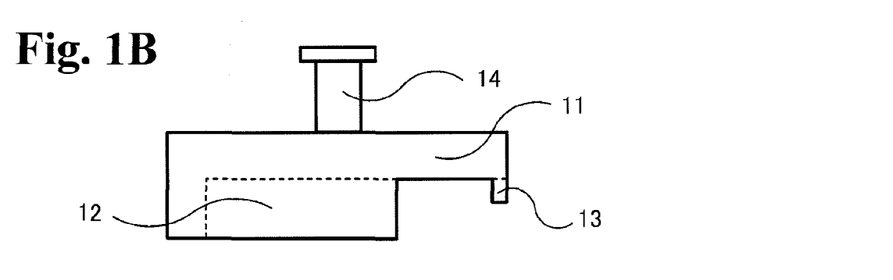
Figure 1C:
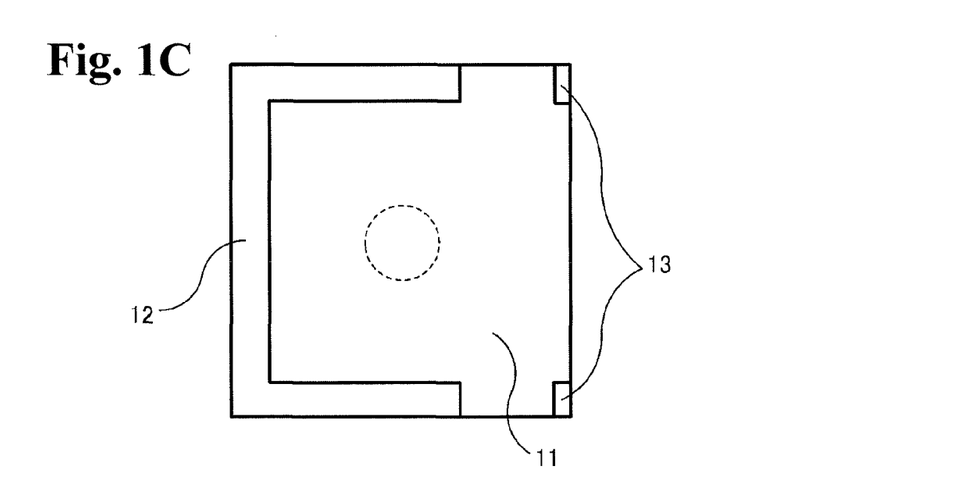

FIGS. 1A, 1B, and 1C are a plan view, front view, and bottom view of a soldering weight according to the embodiment of the invention.

A soldering weight 10 includes a weight main body 11 having a rectangular parallelepiped shape, and a font 12, claws 13, and handle 14 which are attached to the weight main body 11.

The foot 12 is disposed only on the edge of a surface of the rectangular parallelepiped-shaped weight main body 11 opposite to a soldering article. By so doing, it is possible to prevent the weight 10 from interfering with structural objects, for example, an upper distribution of bonding wires, on the upper surface of the soldering article. In other words, it is possible to realize stable soldering in spite of the presence or absence of the structural objects. Also, as the foot 12 is disposed asymmetrically with respect to the line perpendicular to the direction in which a center of gravity 15 of the weight 10 is shifted from the center of the soldering article on the side facing the soldering article, as shown in FIGS. 1A to 1C, the center of gravity 15 of the weight is configured so as to be off the center of the weight 10.

The claws 13 are disposed in corner portions, in which the foot 12 is not disposed, on the surface of the rectangular parallelepiped-shaped weight main body facing the soldering article, and disposed for use in positioning the weight 10 with respect to a soldering jig used with the weight 10 when in a soldering step. As it is possible to take up a wide area of contact with the soldering jig by disposing the claws 13, it is possible to secure the positional relationship of the weight 10 to the soldering jig, for example, even when the weight 10 is excessively upward due to a large warp of a solder plate before the soldering step. Also, as the claws 13 are disposed in the corners of a side surface of the weight main body 11 so as to be spaced from the asymmetrically disposed foot 12, it is easy to position the weight with respect to the soldering article and shift the center of gravity.

The handle 14 is provided in order to facilitate work when installing the weight 10 in the soldering step of a power semiconductor module.

Figure 2A:
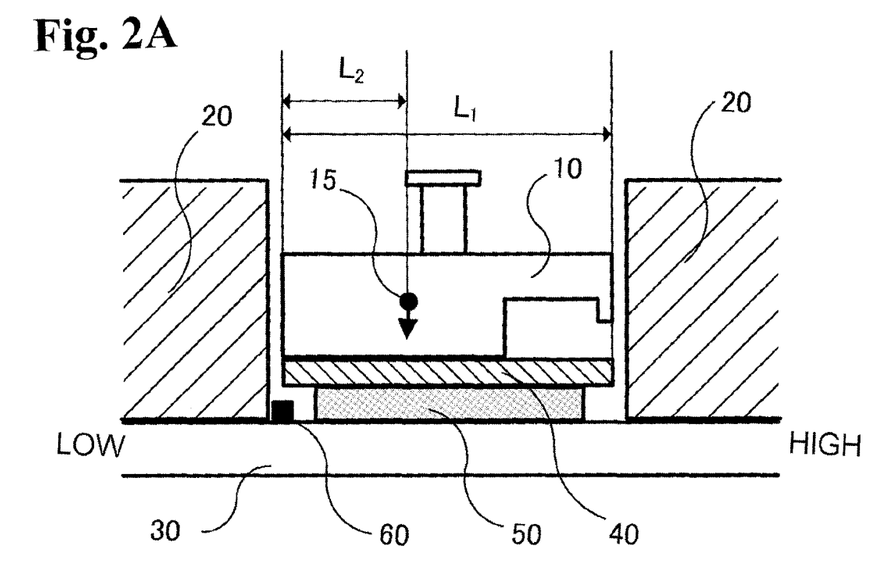
FIG. 2A is a schematic diagram showing a condition before solder melts.
Figure 2B:
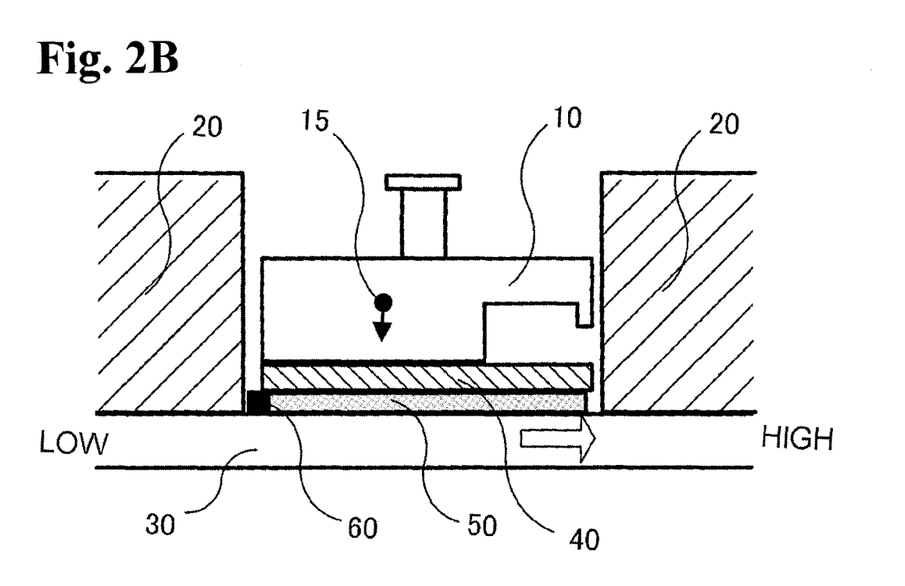
FIG. 2B is a diagram showing a condition in which the solder is being melted at this time.

FIGS. 2A and 2B are schematic diagrams showing a method of soldering a soldering article to a base material according to the embodiment of the invention.

FIG. 2A is a schematic diagram showing a condition before solder melts.

A soldering article 40 is soldered to a base material 30 in the following way. Herein, the base material 30 is of a plate-like rectangular parallelepiped shape, and one or a plurality of soldering articles 40 of a quadrangular shape in plan view is soldered to the principal surface of the base material 30. When the plate-like base material 30 has a downward convex warp, there occurs a difference in height such that when the soldering article is placed on a peripheral portion of the base material 30, a portion of the soldering article on the outer peripheral portion side of the base material 30 is higher in height.

Firstly, a dam member 60 is disposed in an edge portion of a predetermined region of the base material 30 in which the soldering article is mounted. The dam member 60 is disposed in an edge portion of the predetermined region on the side with a lower height when solder melts, as shown in FIG. 2A. The dam member 60 may be of a material, such as a resist material or graphite powder, which is fixed to the base material 30, or placed on rather than being fixed to the base material 30, such as a jig. Also, the dam member 60 may be irregularities or an oxide film formed on the surface of the base material 30 by laser beam irradiation.

Subsequently, a soldering jig 20 having a hole for positioning the soldering article 40 is placed on the base material 30. Furthermore, a solder 50, such as a plate solder material, and the soldering article 40 are placed on a predetermined portion of the base material 30 in such a way that the soldering article 40 is stacked on the solder 50. Furthermore, the weight 10 is placed on the upper surface of the soldering article 40 with the shifted center of gravity on the side with a relatively lower height due to the warp, thus completing preparation for the soldering step.

Subsequently, the temperature of the solder 50 is raised to a temperature equal to or higher than its melting point. A diagram showing a condition in which the solder 50 is being melted at this time is FIG. 2B.

As the dam member 60 is disposed in a portion on the base material 30 on the side with a lower height, a flow of the solder 50 is stemmed, as shown in FIG. 2B. Also, it can be viewed that the solder 50 on the side with the lower height is extruded to the higher side by disposing the weight 10 so that the center of gravity 15 of the weight is shifted to a position with the lower height rather than being placed in the center of the soldering article. The dam member 60 is disposed in a portion on the base material 30 on the side with the lower height, and the weight 10 is disposed with the center of gravity 15 of the weight shifted to the side with the lower height, in this way, thereby increasing the amount of solder on the side with the higher height as compared with in a heretofore known example, meaning that it is possible to suppress an occurrence of a void.

In the invention, the heretofore described kind of advantageous effect is not obtained until the position of the center of gravity 15 of the weight and the ratio of a weight W(g) of the weight and an area A (mm$^2$) of the soldering article are within their respective optimum ranges. Therefore, next, Table 1 will show results of studying the optimum ranges of the heretofore mentioned parameters by examining the molten and solidified state of solder to see whether it is good or bad. This experiment is carried out on the conditions that Sn-5 wt % Sb (a liquidus temperature of 240° C.) is used as a solder material, an H$_2$ gas is used as a temperature rise atmosphere, and they are maintained at or above 300° C. for six minutes.

Herein, the position of the center of gravity 15 of the weight is quantified as G in the following expression (1) using $L_1$ and $L_2$ described in FIG. 2A.

$$G = L_2/L_1 \qquad (1)$$

TABLE 1

|  | center of Gravity G | W/A | Bonded state |
|---|---|---|---|
| Working Example 1 | 0.3 | 0.025 | Good |
| Working Example 2 | 0.3 | 0.002 | Good |
| Working Example 3 | 0.3 | 0.2 | Good |
| Working Example 4 | 0.1 | 0.025 | Good |
| Working Example 5 | 0.45 | 0.025 | Good |
| Comparison Example 1 | 0.05 | 0.025 | Bad |
| Comparison Example 2 | 0.5 | 0.025 | Bad |
| Comparison Example 3 | 0.3 | 0.001 | Bad |
| Comparison Example 4 | 0.3 | 0.25 | Bad |

Working Examples 1 to 5 in Table 1, having no void or bias in thickness in the molten solder 50, are under conditions wherein a good bonded state is obtained. Meanwhile, in Comparison Examples 1 to 4, as a shrinkage void is found, and there is a bias in thickness, in the solder 50 after being melted, conditions are such that no good bonded state is obtained.

Comparison Example 1 is such that as the center of gravity is shifted too far to the low side, the force of diffusing the solder 50 to a position high in level is not enough, thus causing a bias in solder thickness. Also, in Comparison Example 2, as the center of gravity is placed in the center of the soldering article 50, load is applied to the entire bonding surface of the soldering article 50, thus causing a bias in solder thickness and generating a void 51.

In Comparison Example 3, as the weight of the weight is not enough relative to the area of the soldering article, and the function of the weight for applying load is not sufficient, a bias occurs in solder thickness, and a void is also generated. Also, Comparison Example 4 is such that as the weight of the weight is excessive relative to the area of the soldering article, solder in the edge portion of the predetermined region on the side to which the center of gravity is shifted is too thin, and a void is also generated, meaning that a problem arises in the bonded state.

It is found from the results of the experiment that the optimum conditions of the heretofore mentioned parameters are conditions (2) and (3).

$$0.1 \leq G \leq 0.45 \qquad (2)$$

$$0.002 \leq W/A \leq 0.2 \qquad (3)$$

The experiment is carried out using an Sn—Sb based solder material, as previously described, but as the peak temperature at the time of heating carried out in an ordinary soldering step is set to be considerably higher than the melting/liquidus temperature of solder, the solder viscosity of other than an Sn—Sb based solder material also decreases to the same degree, meaning that the same optimum conditions as heretofore described are obtained with any solder material.

Figure 3A:
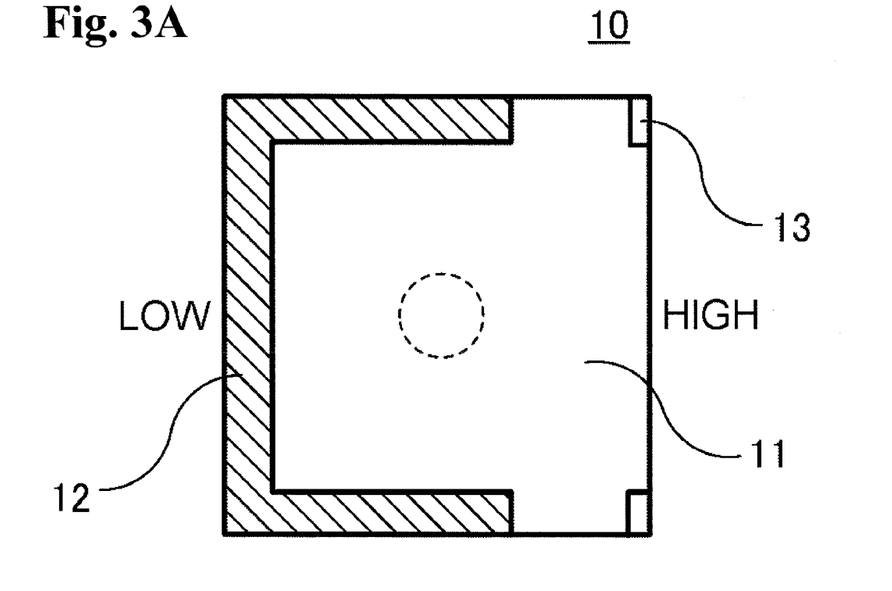
FIG. 3A is a working example when the toot is formed of a U-shaped member.
Figure 3B:
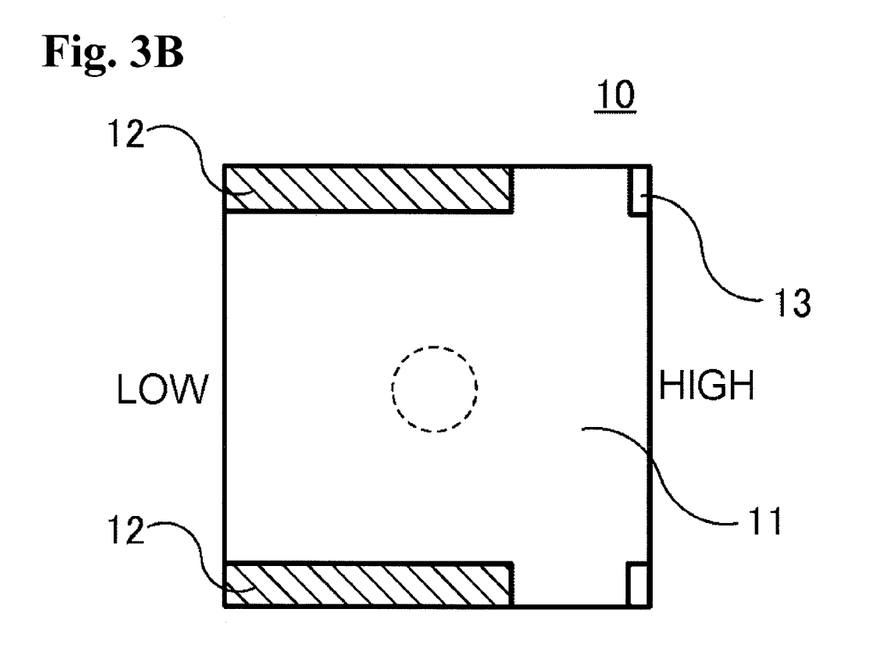
FIG. 3B is a working example when the foot is formed of a plurality of linear shaped members.

Subsequently, a description will be given, in FIGS. 3A and 3B, of a preferred shape of the foot 12 attached to the rectangular parallelepiped-shaped main body 11 of the weight 10 according to the embodiment of the invention. FIGS. 3A and 3B each show a bottom view of the weight 10, that is, a surface facing the soldering article, wherein the foot 12 is shaded with diagonal lines for ease of comprehension.

FIG. 3A is a working example when the foot 12 is formed of a U-shaped member. In this case, as the foot 12 is disposed on three sides of the edge of a surface of the weight main body 11 opposite to the soldering article, it is possible to more stably install the weight 10 on the upper surface of the soldering article.

FIG. 3B is a working example when the foot 12 is formed of a plurality of linear shaped members. In this case, as the foot 12 is of the plurality of linear shaped members, the weight 10 can stand by itself on the upper surface of the soldering article, and the area of the foot 12 is minimum, meaning that this configuration is effective because it is difficult for structural objects on the upper surface of the soldering article to interfere with the weight 10 even when the structural objects lie in a wide area.

As shown in FIGS. 3A and 3B, the foot 12 of the weight 10 may be of any member shape and layout as long as the weight 10 can stand by itself without slanting, is disposed with the position of the center of gravity 15 thereof shifted to an optimum portion, and is disposed so as not to interfere with the structural objects on the upper surface of the soldering article.

The weight main body 11 has a rectangular parallelepiped shape in the working example, and this is because the soldering article (a power semiconductor element or circuit substrate) abutting against the soldering weight generally has a quadrangular shape in plan view, and it is possible to carry out a stable soldering step by positioning the soldering article and soldering weight as a unit using the soldering jig, as shown in FIGS. 2A and 2B. That is, it is preferable to make the shape of the weight main body 11 correspond to the plan view shape of the soldering article.

Also, the material of the weight 10 may be of any kind capable of withstanding high temperature when in the soldering step, and has specific gravity with which it is possible to apply an appropriate load to the solder 50, but preferably, a metal material with high heat resistance and high specific gravity is suitable. Also, the foot 12, claws 13, handle 14, and the like may be of a material the same as that of the weight main body 11, or a material different from that of the weight main body 11 may be used for them in order to more optimally adjust the position of the center of gravity 15.

Figure 4A:
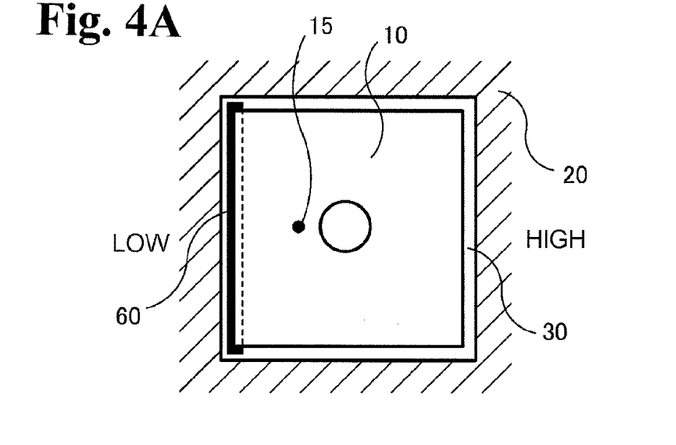
FIG. 4A is a working example when the dam member is disposed only on an edge portion of the predetermined region of the base material on the side with a lower height.
Figure 4B:
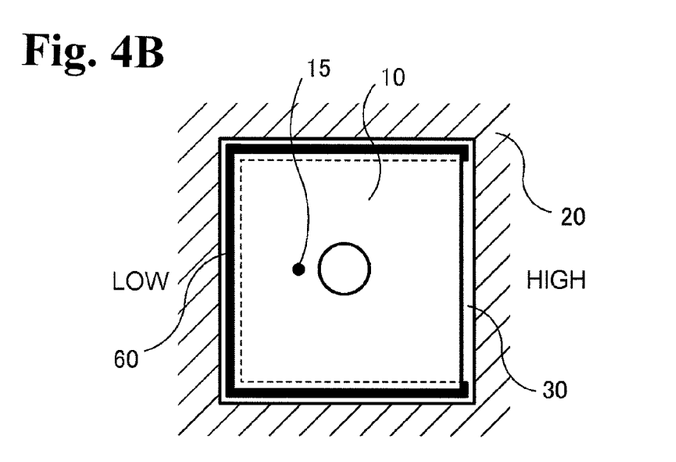
FIG. 4B is a working example when the dam member is disposed on a total of three sides.
Figure 4C:
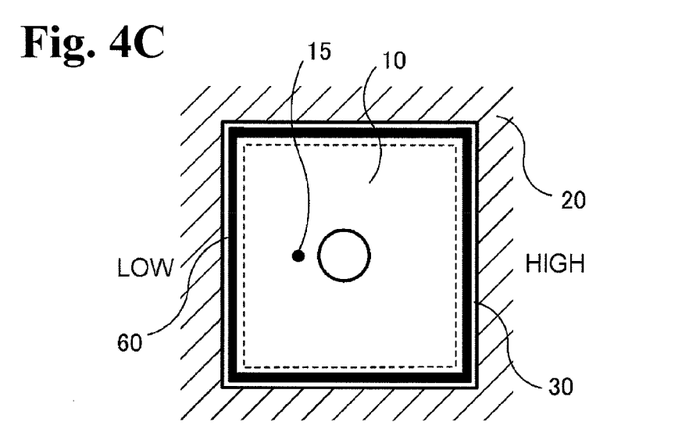
FIG. 4C is a working example when the dam member is disposed on all the sides of the edge of the predetermined region of the base material.

Subsequently, a description will be given, in FIGS. 4A to 4C, of a region in which is disposed the dam portion 60 according to the embodiment of the invention. FIGS. 4A to 4C show plan views when in the soldering preparation step shown in FIG. 2A.

FIG. 4A is a working example when the dam member 60 is disposed only on an edge portion, of the predetermined region of the base material 30, on the side with a lower height (the side to which the center of gravity 15 of the weight is shifted). In this case, as minimal material is required for the dam member 60, this configuration is effective, for example, when it is intended to reduce the cost of the dam member.

FIG. 4B is a working example when the dam member 60 is disposed on a total of three sides; one side, of the edge of the predetermined region of the base material 30, on the side with the lower height (the side to which the center of gravity 15 of the weight is shifted) and two sides of the edge adjacent to the one side. In this case, as it is also possible to prevent solder from running over not only to the side with the lower height, but to the edge portions adjacent thereto, this configuration is effective.

FIG. 4C is a working example when the dam member 60 is disposed on all the sides of the edge of the predetermined region of the base material 30. In this case, as it is possible to prevent solder from running over to all the edge portions, this configuration is effective when it is intended to completely prevent solder from running over.

With regard to the inclination of the base material 30 in the invention, it is possible to obtain high effectiveness when the relationship between a length D and warp value S of the base material 30 shown in FIG. 5 is in the following range (4).

$$0.003 \leq S/D \quad (4)$$

Also, it is possible to make the solder thickness more even by forming a protrusion of a predetermined height on the surface of the base material 30, or containing a filler functioning as a spacer in the solder, in order to prevent the thickness of the solder 50 from being too small due to the load of the weight 10 when in the soldering step.

What is claimed is:

1. A method for manufacturing a semiconductor device, comprising:
    preparing a solder; a soldering article; a base material including a principal surface having a difference in height due to a warp at a temperature equal to or higher than a melting point of the solder; a weight having a weight main body and a foot formed only at a position deviated from a center of the weight main body on an edge of the weight main body on a side facing the soldering article so that a center of gravity of the weight is shifted from the center of the weight main body, and from a center of the soldering article when placed; a positioning jig having a hole for holding the soldering article in a predetermined region of the principal surface of the base material; and a dam member to stem a molten solder,
    disposing the dam member on a side of an edge portion of the predetermined region of the principal surface of the base material in which the edge portion has a relatively lower height due to the warp;
    placing the positioning jig on the principal surface of the base material;
    placing the solder and soldering article in the hole with the soldering article superimposed on the solder;
    placing the weight on an upper surface of the soldering article to position the center of gravity on the side having relatively lower height due to the warp; and
    raising a temperature of the solder to a temperature equal to or higher than a melting point of the solder.

2. A semiconductor device manufacturing method, comprising:
    preparing a solder; a soldering article; a base material including a principal surface having a difference in height due to a warp at a temperature equal to or higher than a melting point of the solder; a weight having a foot only on an edge of a side facing the soldering article to shift a center of gravity of the weight from a center of the soldering article; a positioning jig having a hole for holding the soldering article in a predetermined region of the principal surface of the base material; and a dam member to stem a molten solder,
    disposing the dam member on a side of an edge portion of the predetermined region of the principal surface of the base material in which the edge portion has a relatively lower height due to the warp;
    placing the positioning jig on the principal surface of the base material;
    placing the solder and soldering article in the hole with the soldering article superimposed on the solder;
    placing the weight on an upper surface of the soldering article to position the center of gravity on the side having relatively lower height due to the warp; and
    raising a temperature of the solder to a temperature equal to or higher than a melting point of the solder,
    wherein immediately before the step of raising the temperature of the solder to the temperature equal to or higher than the melting point of the solder, a ratio of L2 to L1 is 0.1 to 0.45;
    L2 is a distance between an edge portion of the soldering article having a relatively lower height due to the warp and a position of the center of gravity of the weight; and
    L1 is a distance between the edge portion of the soldering article having the relatively lower height due to the warp and an edge portion of the soldering article having a height relatively higher due to the warp.

3. The semiconductor device manufacturing method according to claim 1, wherein the weight applied to an area of the principal surface of the soldering article is 0.002 to 0.2 g/mm$^2$.

4. The semiconductor device manufacturing method according to claim 1, wherein a solid structural object is disposed on the upper surface of the soldering article immediately before the step of raising the temperature of the solder to the temperature equal to or higher than the melting point of the solder.

5. The semiconductor device manufacturing method according to claim 1, wherein the dam member is formed of a resist material, a graphite material, a jig, or a laser beam irradiation pattern.

6. The semiconductor device manufacturing method according to claim 1, wherein a protrusion is provided in the predetermined region of the principal surface of the base material.

7. The semiconductor device manufacturing method according to claim 1, wherein the solder contains a filler.

8. The semiconductor device manufacturing method according to claim 1, wherein the weight main body and the foot are integrally formed together as the one weight.

9. The semiconductor device manufacturing method according to claim 8, wherein the weight further includes a claw formed on a side of the weight main body away from the foot and projecting toward the soldering article.

10. The semiconductor device manufacturing method according to claim 1, wherein the foot is formed on the edge of the weight main body without completely surrounding the edge.

* * * * *